US012777579B2

(12) United States Patent
Lee et al.

(10) Patent No.: US 12,777,579 B2
(45) Date of Patent: Oct. 27, 2026

(54) CIRCUIT BOARD AND ANTENNA DEVICE COMPRISING SAME

(71) Applicant: LG INNOTEK CO., LTD., Seoul (KR)

(72) Inventors: In Jae Lee, Seoul (KR); Myoung Lae Roh, Seoul (KR); Gyu Lin Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 304 days.

(21) Appl. No.: 18/564,359

(22) PCT Filed: May 31, 2022

(86) PCT No.: PCT/KR2022/007707

§ 371 (c)(1),
(2) Date: Nov. 27, 2023

(87) PCT Pub. No.: WO2022/255763

PCT Pub. Date: Dec. 8, 2022

(65) Prior Publication Data

US 2024/0260175 A1 Aug. 1, 2024

(30) Foreign Application Priority Data

Jun. 1, 2021 (KR) ........................ 10-2021-0071128
May 16, 2022 (KR) ........................ 10-2022-0059371

(51) Int. Cl.
*H05K 1/02* (2006.01)
*H05K 3/00* (2006.01)

(52) U.S. Cl.
CPC ......... *H05K 1/0286* (2013.01); *H05K 3/0017* (2013.01); *H05K 2201/0141* (2013.01); *H05K 2201/10098* (2013.01); *H05K 2203/1152* (2013.01)

(58) Field of Classification Search
CPC ............... H05K 1/0286; H05K 3/0017; H05K 2201/0141; H05K 2201/10098; H05K 2203/1152
See application file for complete search history.

(56) References Cited

U.S. PATENT DOCUMENTS 10,256,540 B2 4/2019 An et al.
10,797,394 B2 10/2020 Dalmia et al.
11,062,999 B2 7/2021 Lee et al.
2007/0145584 A1 6/2007 Kataoka et al.
2017/0208680 A1 7/2017 Fukuchi
(Continued)

FOREIGN PATENT DOCUMENTS

JP 2005-210058 A 8/2005
JP 2009-215592 A 9/2009
(Continued)

*Primary Examiner* — Jeremy C Norris

(74) *Attorney, Agent, or Firm* — Birch, Stewart, Kolasch & Birch, LLP

(57) ABSTRACT

A circuit board according to an embodiment includes an insulating layer; and a circuit pattern layer disposed on the insulating layer, wherein the circuit pattern layer includes an antenna pattern for transmitting and receiving antenna signals, and wherein a 10-point average surface roughness (Rz) of a surface of the antenna pattern has a range of 0.2 μm to 0.5 μm.

19 Claims, 11 Drawing Sheets

(56) References Cited

U.S. PATENT DOCUMENTS

| | | | | |
|---|---|---|---|---|
| 2020/0373653 | A1* | 11/2020 | Suzuki | H05K 3/18 |
| 2024/0098884 | A1* | 3/2024 | Yoo | H05K 3/421 |

FOREIGN PATENT DOCUMENTS

| | | | |
|---|---|---|---|
| JP | 2011-166028 | A | 8/2011 |
| JP | 2014-3556 | A | 1/2014 |
| JP | 2015-206119 | A | 11/2015 |
| JP | 2018-41998 | A | 3/2018 |
| KR | 10-2017-0085991 | A | 7/2017 |
| KR | 10-2020-0048971 | A | 5/2020 |
| KR | 10-2020-0123150 | A | 10/2020 |
| WO | WO 2013/141658 | A1 | 9/2013 |

* cited by examiner

【FIG. 1】
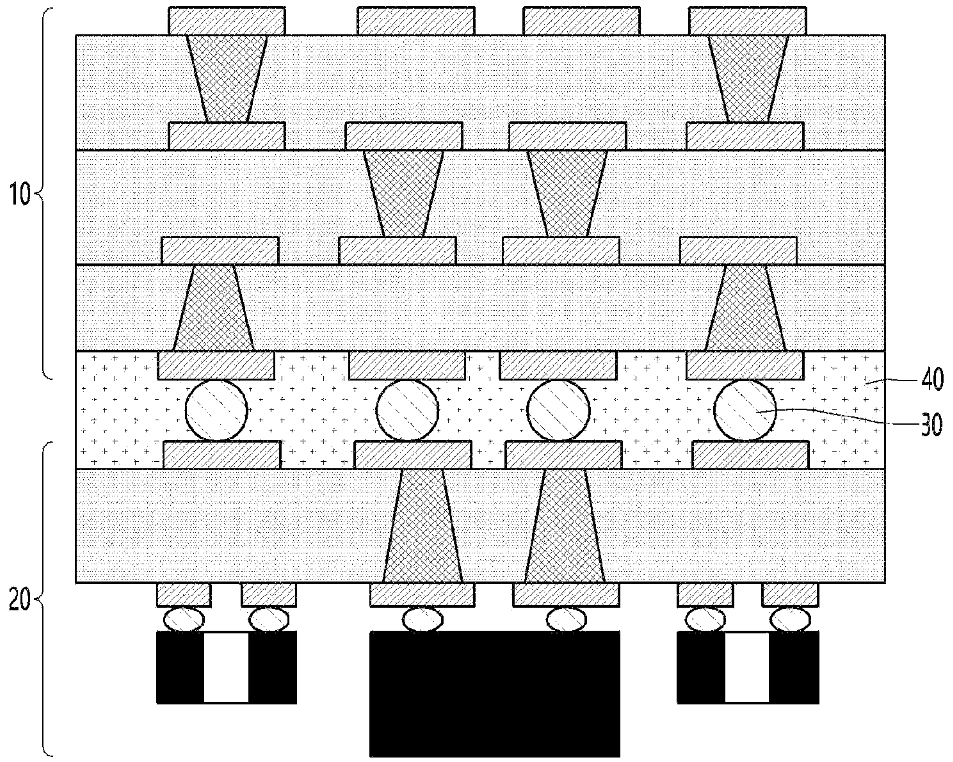

【FIG. 2】
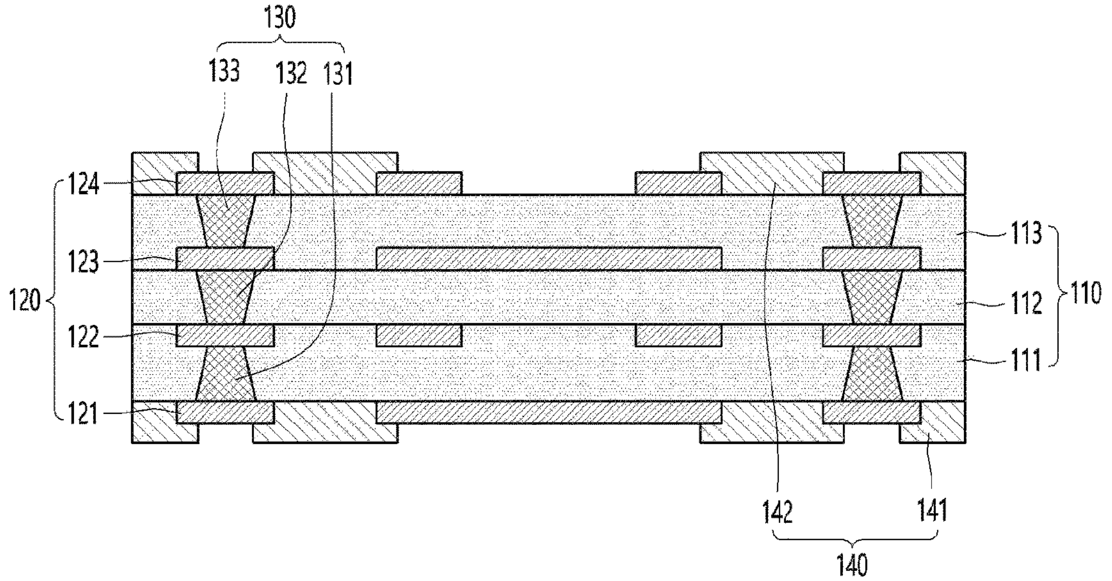
【FIG. 3】
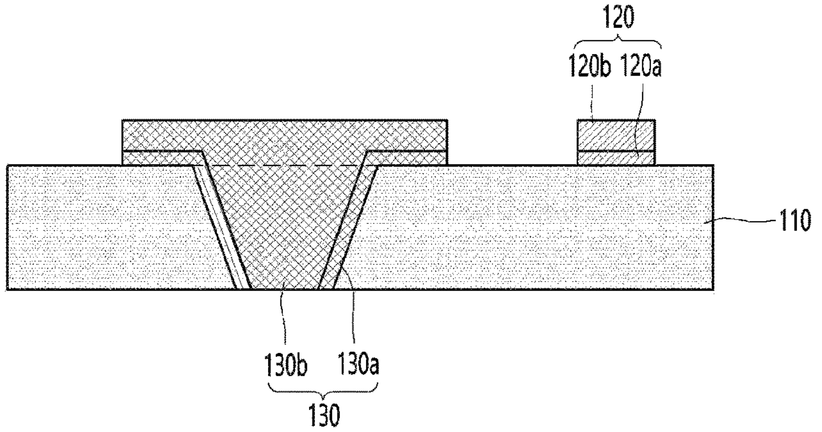

【FIG. 4】
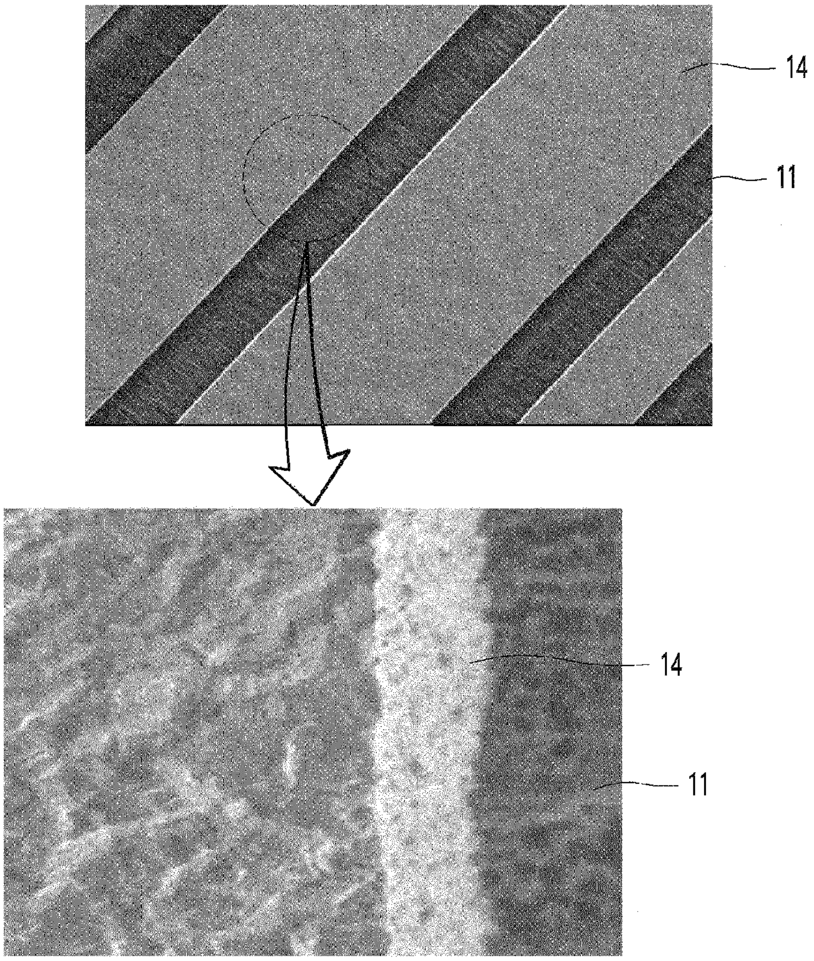

【FIG. 5】
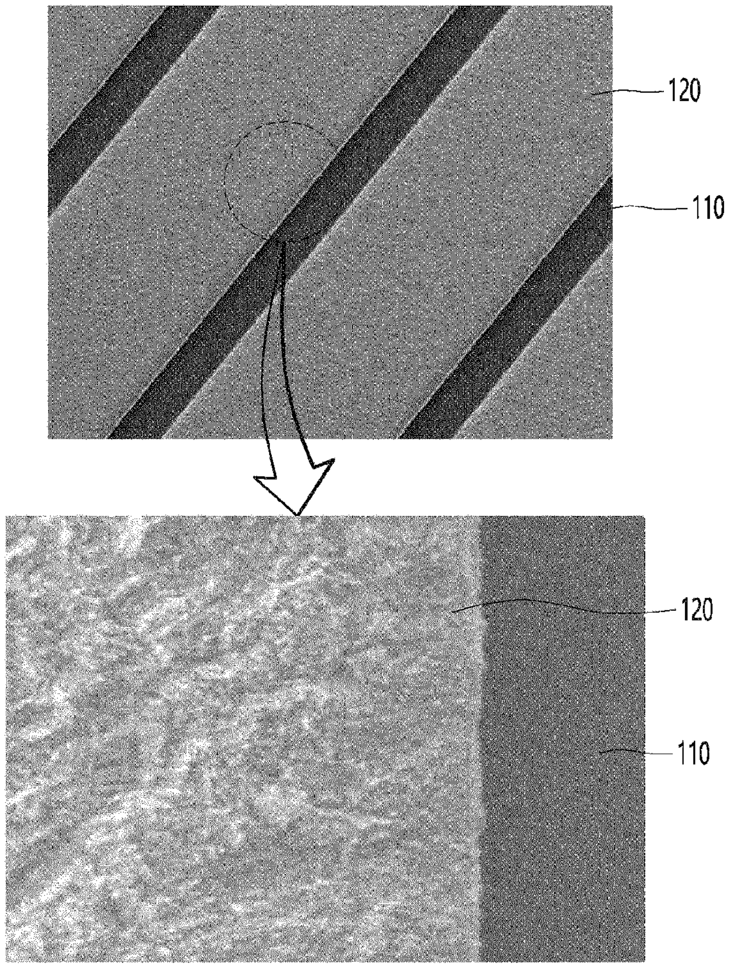

【FIG. 6】
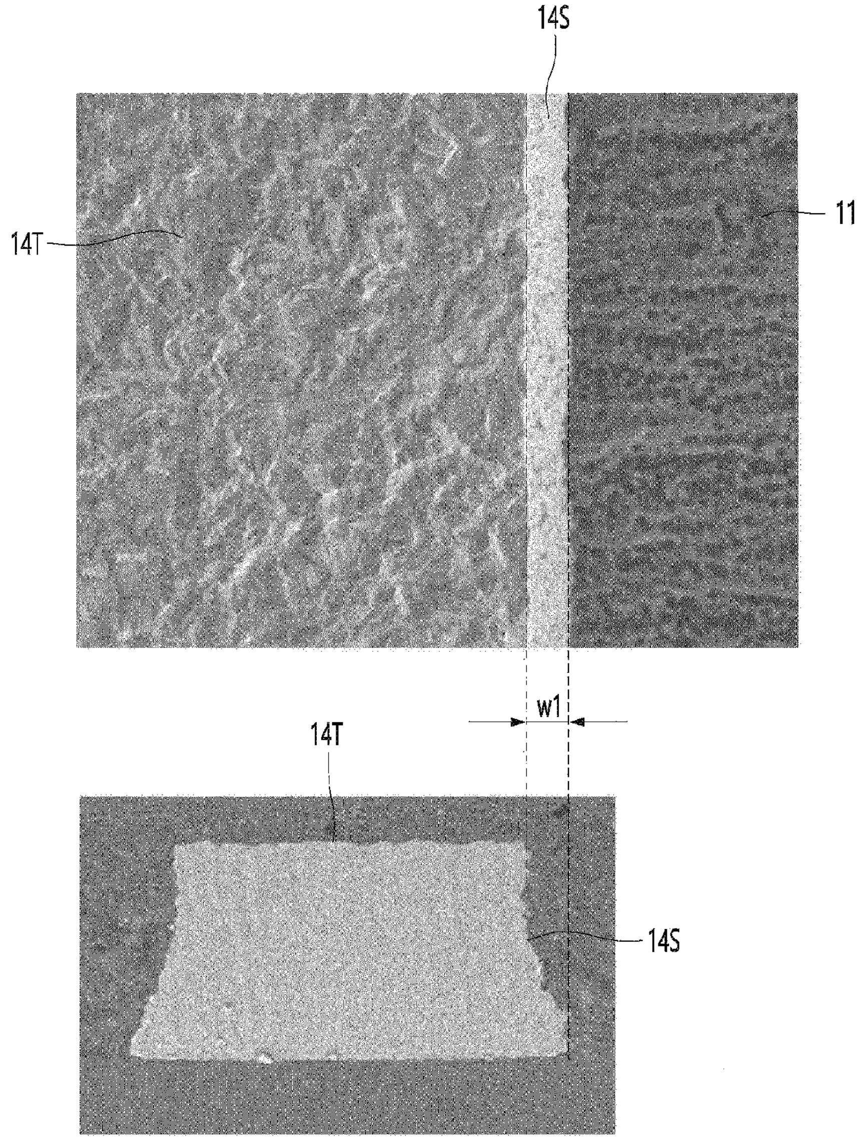

【FIG. 7】
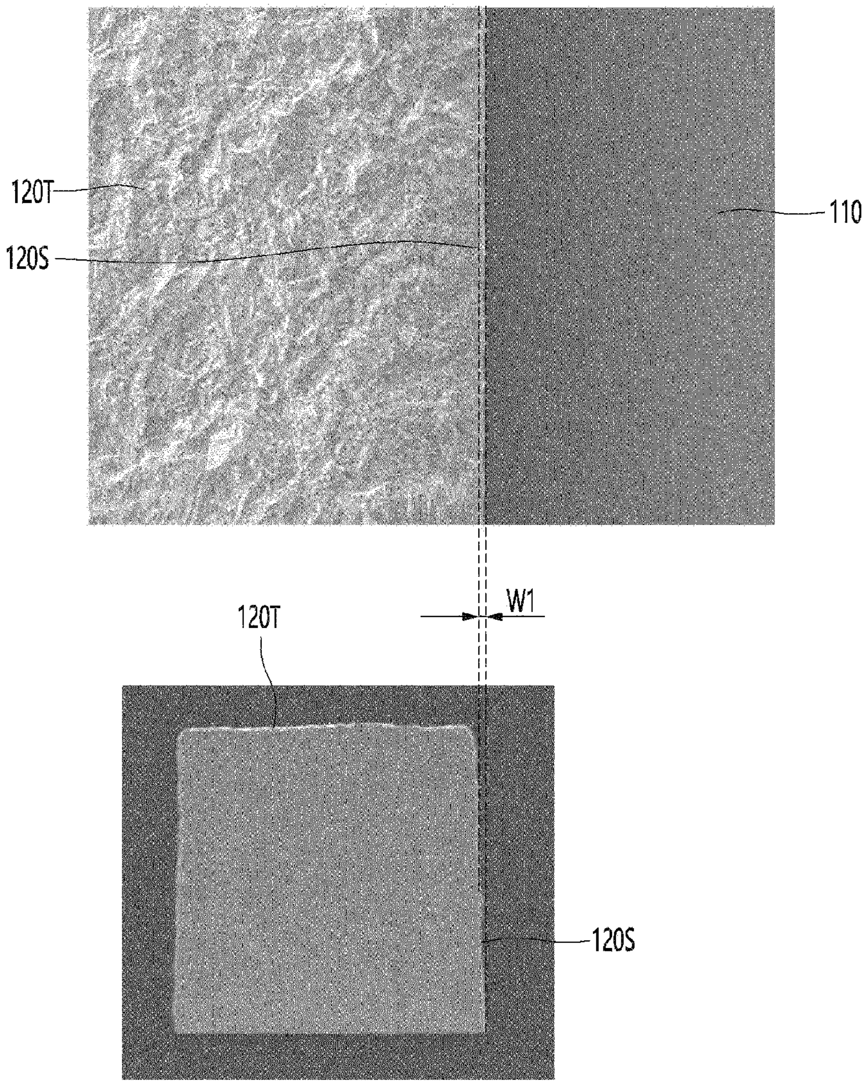

【FIG. 8】
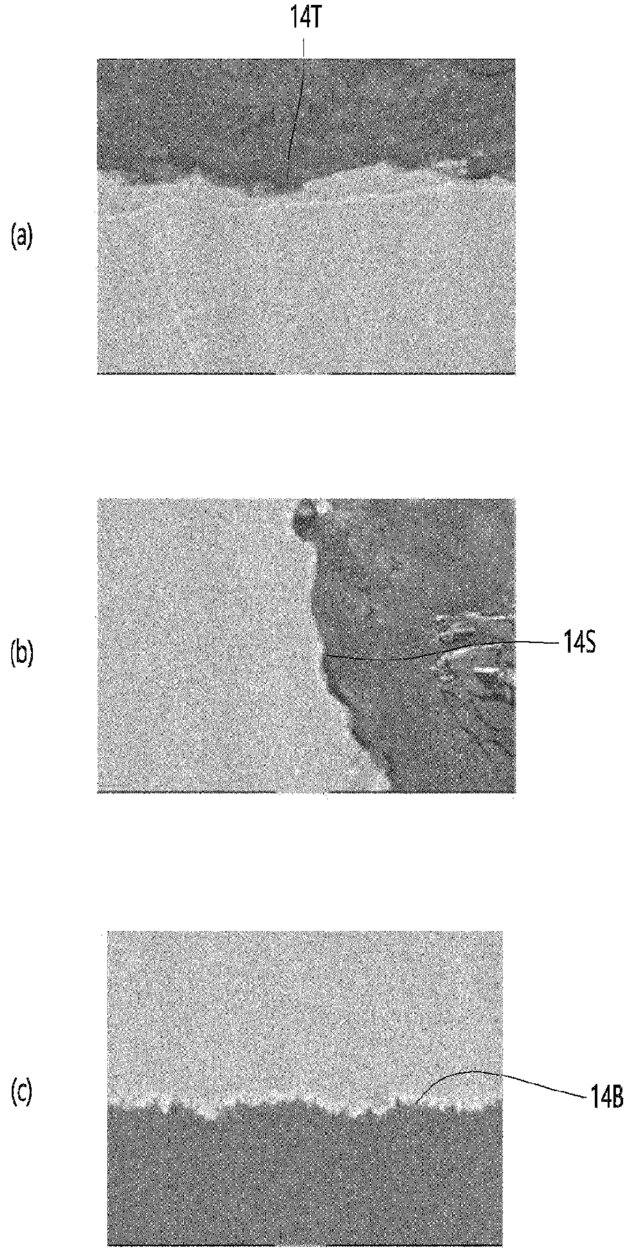

【FIG. 9】
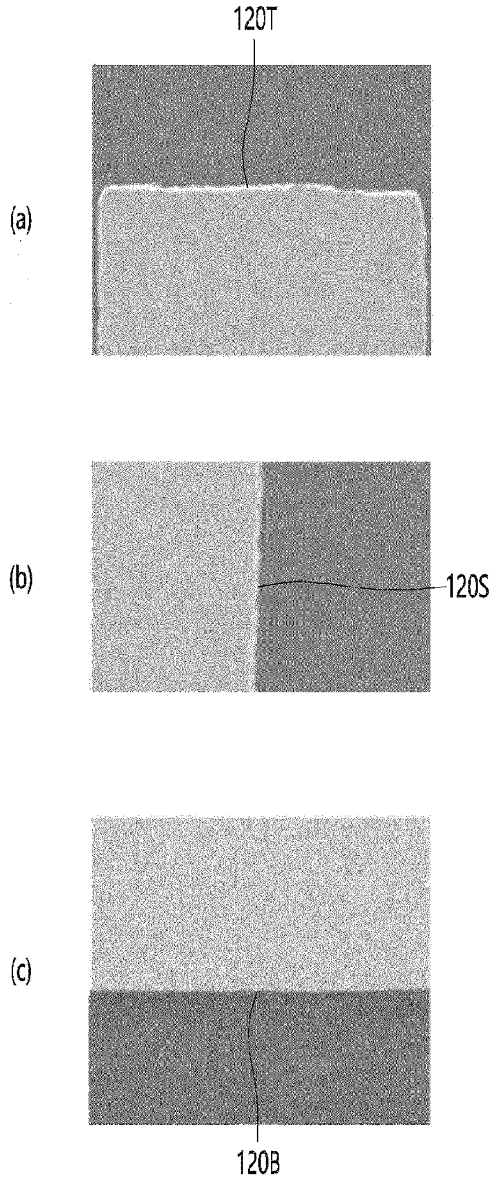

【FIG. 10】
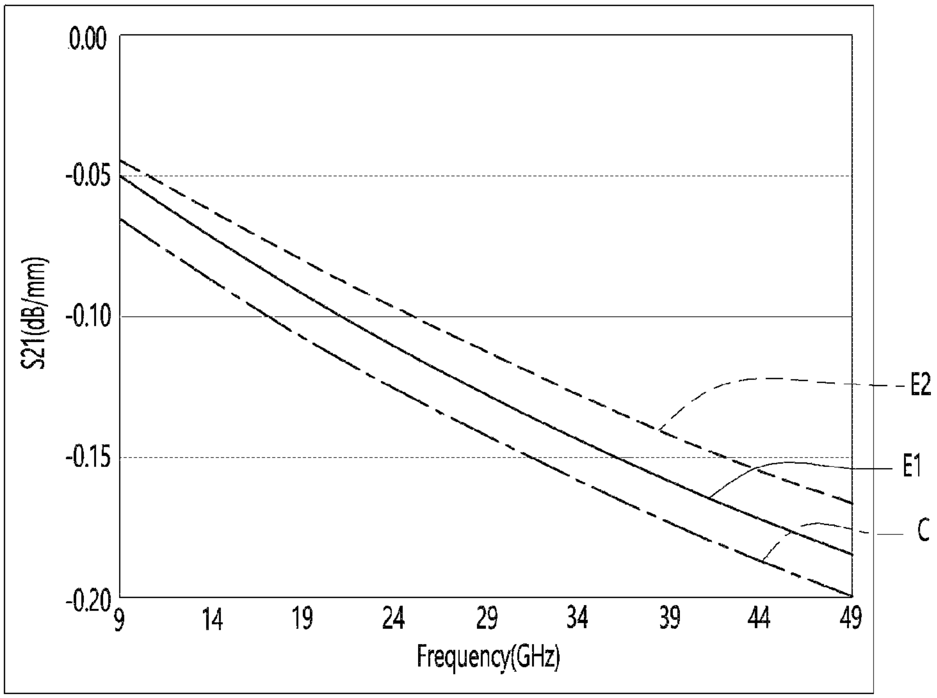
【FIG. 11】
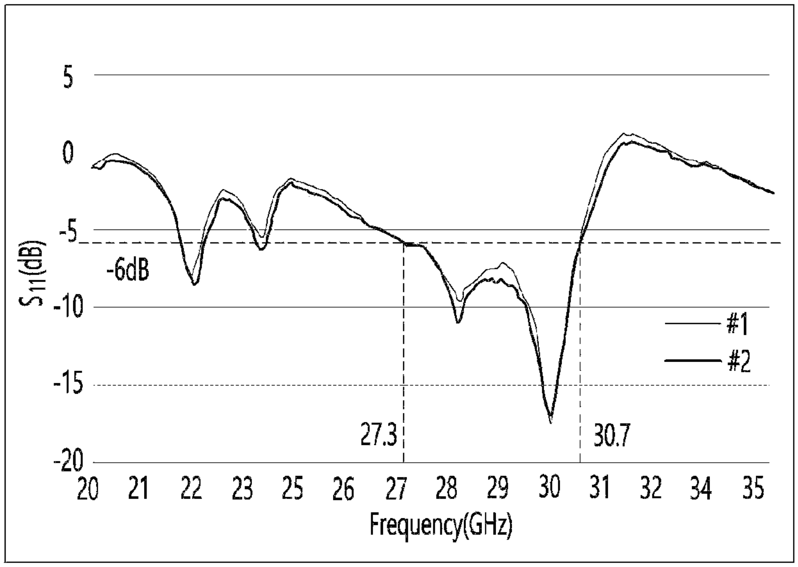

【FIG. 12】
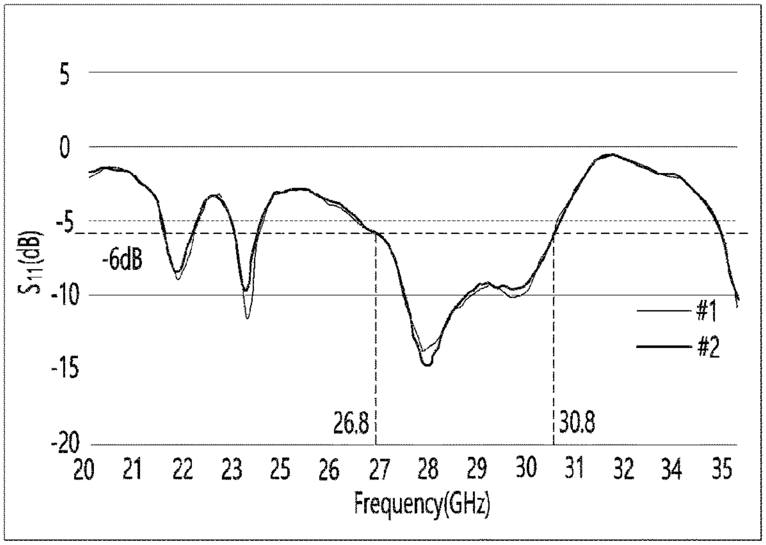
【FIG. 13】
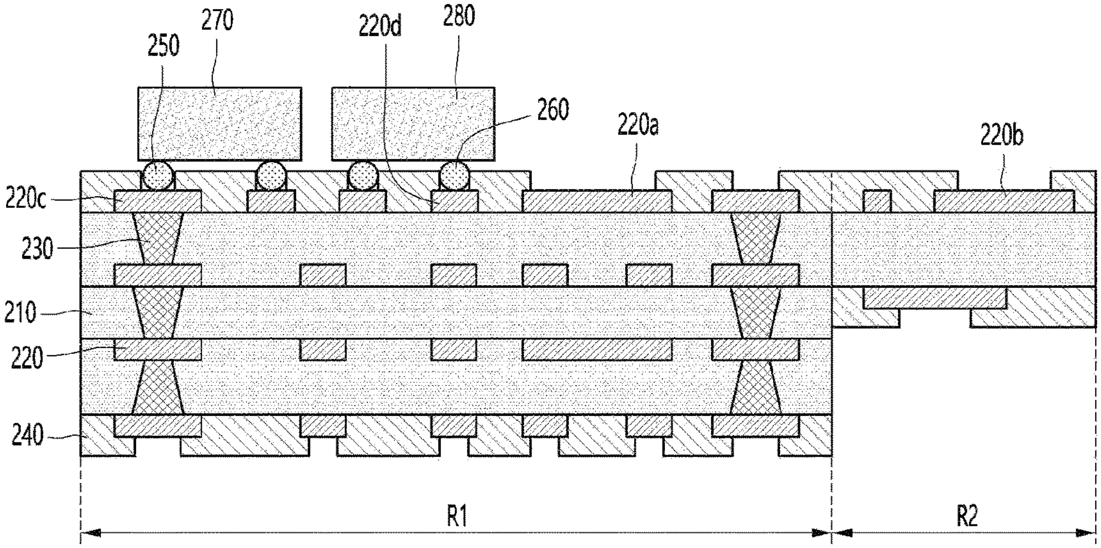

【FIG. 14】
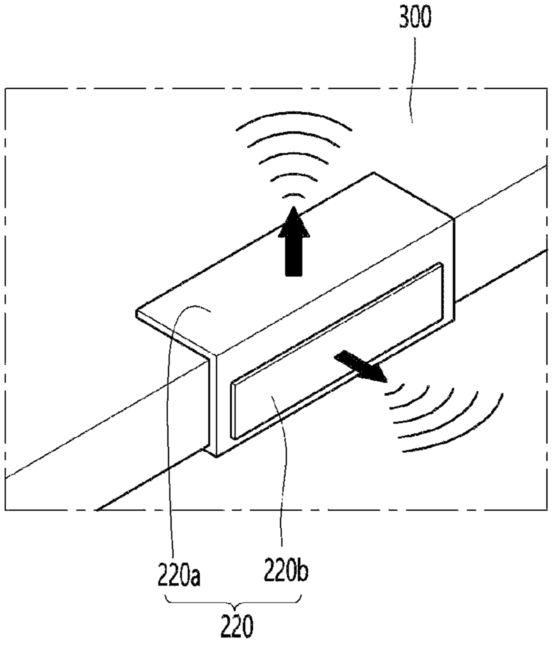

CIRCUIT BOARD AND ANTENNA DEVICE COMPRISING SAME

CROSS REFERENCE TO RELATED APPLICATIONS

This application is the National Phase of PCT/KR2022/007707 filed on May 31, 2022, which claims priority under 35 U.S.C. § 119 (a) to Patent Application Nos. 10-2021-0071128 and 10-2022-0059371 filed in the Republic of Korea on Jun. 1, 2021 and May 16, 2022, all of which are hereby expressly incorporated by reference into the present application.

BACKGROUND

Technical Field

An embodiment relates to a circuit board and an antenna device including the same.

Discussion of the Related Art

Recently, efforts have been made to develop improved 5G (5th generation) communication systems or pre-5G communication systems to meet the demand for wireless data traffic.

The 5G communication system uses ultra-high frequency (mm-Wave) bands (sub 6 GHz, 28 GHZ, 38 GHz or higher frequencies) to achieve high data transfer rates. This high frequency band is called mm-Wave due to the length of the wavelength.

In order to alleviate the path loss of radio waves in the ultra-high frequency band and increase the transmission distance of radio waves, integration technologies such as beamforming, massive MIMO, and array antenna are being developed in 5G communication systems.

FIG. 1 is a view showing an antenna device.

Referring to FIG. 1, an antenna device according to a comparative example includes a plurality of substrates. That is, the antenna device of the comparative example includes a first substrate 10 corresponding to an antenna unit and a second substrate 20 corresponding to a driving unit.

At this time, the second substrate 20 is manufactured through a separate process from the first substrate 10. For example, in the comparative example, the first substrate 10 and the second substrate 20 are manufactured through separate processes, and then a process of coupling them is performed. The second substrate 20 includes a driving element.

At this time, the first substrate 10 and the second substrate 20 of the comparative example are coupled by the solder ball 30. The solder ball 30 has a structure covered by a molding layer 40.

At this time, in the antenna device of the comparative example, the first substrate 10 and the second substrate 20 are coupled in a vertically aligned state. In addition, an antenna package substrate of the comparative example has a structure connected to the first substrate 10 and the second substrate 20 through a solder ball 30 disposed between the first substrate 10 and the second substrate 20.

Accordingly, in the comparative example, as the first substrate 10 and the second substrate 20 are connected to each other through the solder ball 30, there is a problem in that a thickness of the antenna package substrate increases by a height of the solder ball 30.

Furthermore, in the comparative example, the first substrate 10 and the second substrate 20 have a vertically stacked structure and are coupled to each other through the solder ball 30 as described above, and accordingly, the transmission length of the signal increases, and there is a problem that signal loss increases as the transmission length (e.g., signal transmission distance) becomes longer.

In addition, in the comparative example, the first substrate 10 and the second substrate 20 were connected through a connector structure using a separate flexible circuit board (not shown) instead of the solder ball 30. However, when the first substrate 10 and the second substrate 20 are electrically connected to each other using the flexible circuit board, although the first and second substrates have a horizontal arrangement structure, the signal transmission distance increases as the length of the flexible circuit board increases, and there is a problem of increased signal loss.

SUMMARY

An embodiment provides a circuit board with improved antenna characteristics and an antenna device including the same.

In addition, the embodiment provides a circuit board that can reduce a surface roughness of an antenna pattern and an antenna device including the same.

In addition, the embodiment provides a circuit board that can minimize the difference between upper and lower widths of an antenna pattern and an antenna device including the same.

A circuit board according to an embodiment comprises an insulating layer; and a circuit pattern layer disposed on the insulating layer, wherein the circuit pattern layer includes an antenna pattern for transmitting and receiving antenna signals, and wherein a 10-point average surface roughness (Rz) of a surface of the antenna pattern has a range of 0.2 μm to 0.5 μm.

In addition, the antenna pattern includes an upper surface and a lower surface opposite to the upper surface, and a width of the upper surface of the antenna pattern is smaller than a width of the lower surface of the antenna pattern.

In addition, the width of the upper surface of the antenna pattern is 95% or more of the width of the lower surface of the antenna pattern.

In addition, a difference between the width of the upper surface and the lower surface of the antenna pattern satisfies a range of 0.5 μm to 1.2 μm.

In addition, the antenna pattern includes an upper surface, a lower surface opposite to the upper surface, and a side surface connecting the upper surface and the lower surface, and wherein a horizontal distance between one end of the upper surface of the antenna pattern and one end of the lower surface of the antenna pattern connected to the side of the antenna pattern satisfies a range of 0.25 μm to 0.6 μm.

In addition, the side surface of the antenna pattern includes a curved surface.

In addition, an etching factor of the antenna pattern is 40 or more, and wherein the etching factor is determined by a following formula: etching factor=thickness of antenna pattern/(width of lower surface of antenna pattern-width of upper surface of antenna pattern).

In addition, the antenna pattern includes a first metal layer disposed on the insulating layer; and a second metal layer disposed on the first metal layer and containing a different metal from the first metal layer.

In addition, the first metal layer includes nickel and chromium, and the second metal layer includes copper.

In addition, the insulating layer is divided into a first region and a second region in a horizontal direction, wherein the antenna pattern includes a first antenna pattern disposed in the first region of the insulating layer; and a second antenna pattern disposed in the second region of the insulating layer, and wherein a number of layers in the first region of the insulating layer is greater than a number of layers in the second region of the insulating layer, and wherein the second region of the insulating layer is bent based on the first region of the insulating layer.

In addition, an insulating material of the first region of the insulating layer is same as an insulating material of the second region of the insulating layer, and the insulating material includes liquid crystal polymer (LCP).

Meanwhile, the antenna device according to the embodiment comprises an insulating layer including a first region and a second region bendable from the first region; a first antenna pattern disposed in the first region of the insulating layer; a second antenna pattern disposed in the second region of the insulating layer; a first pad disposed in the first region of the insulating layer; a second pad disposed in the first region of the insulating layer; a first connection part disposed on the first pad; a second connection part disposed on the second pad; a communication element mounted on the first connection part and connected to the first and second antenna patterns; and a power element mounted on the second connection part and connected to the first and second antenna patterns, and wherein a 10-point average surface roughness (Rz) of each surface of the first and second antenna patterns has a range of 0.2 μm to 0.5 μm.

In addition, each of the first and second antenna patterns includes an upper surface and a lower surface opposite to the upper surface, wherein a width of the upper surface is smaller than the width of the lower surface, and wherein the width of the upper surface is 95% or more of the width of the lower surface.

In addition, a difference between the width of the upper surface and the width of the lower surface satisfies a range of 0.5 μm to 1.2 μm.

In addition, the first and second antenna patterns include an upper surface, a lower surface opposite to the upper surface, and a side surface connecting the upper surface and the lower surface, and wherein a horizontal distance between one end of the upper surface and one end of the lower surface, which are respectively connected to one end and the other end of the side surface, satisfies a range of 0.25 μm to 0.6 μm.

In addition, the antenna pattern includes a first metal layer disposed on the insulating layer and including nickel and chromium; and a second metal layer disposed on the first metal layer and including copper.

In addition, an insulating material of the first region of the insulating layer is same as an insulating material of the second region of the insulating layer, and wherein the insulating material includes liquid crystal polymer (LCP).

Advantageous Effects

The embodiment may provide a circuit board with improved antenna characteristics and an antenna device including the same.

Specifically, the circuit board of the embodiment includes a circuit pattern layer corresponding to an antenna pattern. The circuit pattern layer includes a first metal layer, which is a thin film layer containing a first metal, and a second metal layer disposed on the first metal layer and containing a second metal. At this time, in the embodiment, the second metal layer is formed using the first metal layer. Accordingly, the embodiment can minimize damage to the second metal layer that occurs during a process of etching the first metal layer.

Accordingly, a 10-point average surface roughness (Rz) of a surface of the circuit pattern layer of the embodiment has a range of 0.2 μm to 0.5 μm. In addition, a difference value between upper and lower widths of the circuit pattern layer in the embodiment satisfies a range of 0.5 μm to 1.2 μm. In addition, the upper width of the circuit pattern layer in the embodiment is 95% or more of the lower width of the circuit pattern layer. Furthermore, a horizontal distance W1 between one end of the upper surface and one end of the lower surface connected to a side surface of the circuit pattern layer of the embodiment satisfies a range of 0.25 μm to 0.6 μm. Furthermore, the etching factor of the circuit pattern layer of the embodiment is 40 or more.

At this time, if the difference value between the upper and lower widths of the circuit pattern layer is less than 0.5 μm, plating properties in a process of forming the circuit pattern layer 120 may deteriorate. For example, if the difference value between the upper and lower widths of the circuit pattern layer is less than 0.5 μm, a problem may occur in which plating is not completely carried out to a lower region of a dry film during a process of plating. As a result, an undercut may be formed at a lower surface of the circuit pattern layer, which may cause a problem in which communication characteristics of the circuit board are deteriorated.

In addition, if the difference value between the upper and lower widths of the circuit pattern layer is greater than 1.2 μm, the frequency bandwidth of the signal transmitted by the circuit pattern layer may decrease. Specifically, the frequency bandwidth of the signal increases as the difference value between the upper and lower widths decreases. In addition, if the difference between the upper and lower widths of the circuit pattern layer is greater than 1.2 μm, the frequency bandwidth is reduced as shown in the comparative example of FIG. 11, and the communication characteristics of the circuit board may deteriorate accordingly.

In addition, if the upper width of the circuit pattern layer is less than 95% of the lower width of the circuit pattern layer, as described above, plating properties may be reduced in a process of forming the circuit pattern layer, and as a result, an undercut may be formed on the lower surface of the circuit pattern layer.

In addition, if a horizontal distance W1 of the circuit pattern layer of the embodiment is less than 0.25 μm, as described above, plating properties may be reduced in the process of forming the circuit pattern layer, and as a result, an undercut may be formed on the lower surface of the circuit pattern layer. In addition, if the horizontal distance W1 of the circuit pattern layer of the embodiment exceeds 0.6 μm, the frequency bandwidth may be reduced as described above, and accordingly, the communication characteristics of the circuit board may deteriorate.

In addition, if an etching factor of the circuit pattern layer is less than 40, the difference value between the upper and lower widths of the circuit pattern layer and/or the horizontal distance (W1) may deviate from a target range, and this may cause problems with deterioration of plating properties or reduction of frequency bandwidth.

Accordingly, the circuit board of the embodiment and the antenna device including the same can reduce signal transmission loss that occurs in the process of transmitting a signal in a high frequency band. Furthermore, the circuit board of the embodiment and the antenna device including the same can improve frequency bandwidth.

In addition, the circuit board of the embodiment includes a first region and a second region spaced apart from each other in the horizontal direction including each of first and second antenna pattern layers. In addition, the second region is a flexible region that can be bent relative to the first region. In addition, a communication element connected to the first and second antenna pattern layers is disposed in the first region. The first and second antenna pattern layers radiate antenna signals in different directions. In addition, the communication element controls the first and second antenna pattern layers. Accordingly, the embodiment can control a plurality of antenna pattern layers that radiate antenna signals in different directions using one communication element. Through this, the embodiment enables miniaturization of the antenna device.

BRIEF DESCRIPTION OF THE DRAWINGS

FIG. 1 is a view showing an antenna device of a comparative example.

FIG. 2 is a view showing an antenna substrate according to an embodiment.

FIG. 3 is a cross-sectional view showing a layer structure of a circuit pattern layer and a through electrode in an embodiment.

FIG. 4 is a scanning electron microscope (SEM) photograph showing a roughness of a circuit pattern layer of a comparative example.

FIG. 5 is a scanning electron microscope (SEM) photograph showing a roughness of a circuit pattern layer of an embodiment.

FIG. 6 is a scanning electron microscope (SEM) photograph for explaining a side surface shape and etching factor of a circuit pattern layer of a comparative example.

FIG. 7 is a scanning electron microscope (SEM) photograph for explaining a side surface shape and etching factor of a circuit pattern layer of an embodiment.

FIG. 8 is a scanning electron microscope (SEM) photograph showing a surface of a circuit pattern layer of a comparative example.

FIG. 9 is a scanning electron microscope (SEM) photograph showing a surface of a circuit pattern layer of an embodiment.

FIG. 10 is a view showing signal characteristics according to a roughness of a circuit pattern layer.

FIG. 11 is a view showing a frequency bandwidth of a circuit board of a comparative example.

FIG. 12 is a view showing a frequency bandwidth of a circuit board according to an embodiment.

FIG. 13 is a view showing an antenna device according to an embodiment.

FIG. 14 is a view showing a part of a terminal to which the antenna device of FIG. 13 is applied.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

FIG. 2 is a view showing an antenna board according to an embodiment.

Referring to FIG. 2, the antenna board includes an insulating layer 110, a circuit pattern layer 120, a through electrode 130, and a protective layer 140.

The insulating layer 110 is composed of multiple layers.

For example, the insulating layer 110 may include a first insulating layer 111, a second insulating layer 112, and a third insulating layer 113. In FIG. 2, the insulating layer 110 is shown as being composed of three layers, but the embodiment is not limited thereto. The insulating layer 110 may have a number of layers of 2 or less, and may have a number of layers of 4 or more.

The insulating layer 110 has flexible characteristics. The insulating layer 110 may be made of polyimide (PI). Alternatively, the insulating layer 110 may be made of liquid crystal polymer (LCP). However, the embodiment is not limited to this. For example, the insulating layer 110 may be made of an insulating material that does not contain glass fibers, such as polyethylene terephthalate (PET), polyethylene naphthalate (PEN), polycarbonate (PC), polyethersulfone (PES), Polyacrylate (PAR).

Preferably, the insulating layer 110 of the embodiment is formed of liquid crystal polymer (LCP). In addition, when the insulating layer 110 is formed of liquid crystal polymer (LCP), it is easy to control the dielectric constant of the insulating layer 110, and through this, the insulating layer 110 can be made to have a dielectric constant that can minimize signal transmission loss in a high frequency band. Furthermore, when the insulating layer 110 is formed of liquid crystal polymer (LCP), a process of manufacturing the circuit board can be improved and an overall thickness of the circuit board can be reduced.

As a result, the insulating layer 110 is bent while having a partially curved surface. That is, the insulating layer 110 may be partially flat and partially curved and curved. In detail, the insulating layer 110 may have a curved end and be curved, or may have a surface with random curvature and be curved or bent.

The circuit board includes a circuit pattern layer 120.

The circuit pattern layer 120 includes a first circuit pattern layer 121, a second circuit pattern layer 122, a third circuit pattern layer 123, and a fourth circuit pattern layer 124.

The circuit pattern layer 120 includes an antenna pattern that functions as an antenna. For example, the circuit pattern layer 120 includes an antenna signal pattern. The antenna signal pattern functions to transmit antenna signals and data signals.

Accordingly, the circuit pattern layer 120 may be implemented as a patch antenna, but is not limited thereto. For example, the circuit pattern layer 120 may be implemented as a dipole antenna. In addition, the circuit pattern layer 120 may be implemented as a combination of a patch antenna and a dipole antenna.

In addition, the circuit pattern layer 120 further includes a ground pattern or a power pattern.

The circuit pattern layer 120 includes a highly conductive metal material. For example, the circuit pattern layer 120 may be made of copper (Cu), aluminum (Al), silver (Ag), tin (Sn), gold (Au), nickel (Ni), lead (Pb), and titanium (Ti), or may be an alloy thereof.

The circuit board includes through electrode 130.

The through electrode 130 includes a first through electrode 131, a second through electrode 132, and a third through electrode 133. The first through electrode 131 passes through the first insulating layer 111. The second through electrode 132 passes through the second insulating layer 112. The third through electrode 133 passes through the third insulating layer 113. The through electrode 130 electrically connects circuit pattern layers arranged in different layers. The through electrode 130 may include a same material as a material of the circuit pattern layer 120. The through electrode 130 may have a tapered shape.

The circuit board includes a protective layer 140.

The protective layer 140 includes a first protective layer 141 disposed on a lower surface of the first insulating layer 111. In addition, the protective layer 140 includes a second protective layer 142 disposed on an upper surface of the third insulating layer 113. The protective layer 140 may be solder resist, but is not limited thereto.

The circuit board of the present application has antenna characteristics that are superior to those of the circuit board in the comparative example.

This is achieved by the characteristics of the circuit pattern layer 120 included in the embodiment of the present application.

That is, a surface roughness of the circuit pattern layer 120 of the embodiment is smaller than that of the circuit pattern layer of the comparative example. As a result, the circuit board of the embodiment can reduce signal transmission loss that occurs in a process of transmitting signals in a high frequency band.

In addition, a vertical cross-sectional shape of the circuit pattern layer 120 included in the embodiment of the present application is close to a square shape. For example, a side surface of the circuit pattern layer 120 in the embodiment is close to a right angle with respect to a lower surface of the circuit pattern layer 120. For example, the side surface of the circuit pattern layer 120 in the embodiment is close to a straight line. In contrast, the side surface of the circuit pattern layer in the comparative example is close to a curve. This can also be expressed as the difference value between upper and lower widths of the circuit pattern layer 120. That is, a difference value between the upper and lower widths of the circuit pattern layer 120 in the embodiment is smaller than a difference value between the upper and lower widths of the circuit pattern layer in the comparative example. This can also be expressed as an etching factor of the circuit pattern layer. The etching factor is a value obtained by dividing the thickness of the circuit pattern layer by the difference value between the upper and lower widths of the circuit pattern layer. In addition, the circuit pattern layer 120 of the embodiment has a difference value between the upper width and the lower width close to 0. Accordingly, the etching factor of the circuit pattern layer 120 of the embodiment is higher than that of the circuit pattern layer of the comparative example.

Accordingly, the circuit board of the embodiment can increase the frequency bandwidth. That is, as shown in FIG. 11, when the difference value between the upper and lower widths of the circuit pattern layer 120 increases or the etching factor of the circuit pattern layer 120 decreases, it was confirmed that the frequency bandwidth available for signal transmission decreased. In addition, the embodiment increases the etching factor of the circuit pattern layer 120 while reducing the difference value between the upper and lower widths of the circuit pattern layer 120 compared to the comparative example by the features described below, and accordingly, the frequency bandwidth available in products to which the circuit board is applied can be increased. This will be explained in more detail below.

The etching factor of the circuit pattern layer of the embodiment is higher than the etching factor of the circuit pattern layer in the comparative example.

For example, the circuit board of the embodiment may provide a broadband antenna pattern.

Hereinafter, the circuit pattern layer 120 having the above characteristics will be described in detail.

FIG. 3 is a cross-sectional view showing a layer structure of a circuit pattern layer and a through electrode in an embodiment.

Referring to FIG. 3, the circuit pattern layer 120 includes a plurality of metal layers. The circuit pattern layer 120 includes a first metal layer **120*a* disposed on the insulating layer 110 and a second metal layer 120*b* disposed on the first metal layer 120*a*. The first metal layer 120*a* and the second metal layer 120*b*** include different metal materials.

The first metal layer **120*a* includes nickel and chromium. The first metal layer 120*a* may be an alloy layer of nickel and chromium. Alternatively, the first metal layer 120*a*** may include a nickel layer and a chromium layer.

The first metal layer **120*a* is deposited on the insulating layer 110 using a sputtering method. Accordingly, the first metal layer 120*a* may be formed as a thin film on the insulating layer 110**.

The second metal layer **120*b* is an electrolytic plating layer formed by electroplating the first metal layer 120*a* as a seed layer. The second metal layer 120*b* includes a metal material different from that of the first metal layer 120*a*. For example, the second metal layer 120*b*** may include copper.

In addition, the through electrode 130 has a layer structure corresponding to the layer structure of the circuit pattern layer 120. That is, the through electrode 130 includes a first metal layer **130*a* and a second metal layer 130*b*. The first metal layer 130*a* of the through electrode 130 includes nickel and chromium. In addition, the second metal layer 130***b* of the through electrode 130 may include a metal different from that of the first metal layer 130*a*, for example, copper.

At this time, in the embodiment, the circuit pattern layer 120 includes a first metal layer 120*a* and a second metal layer 120*b* made of different metal materials. In addition, the first metal layer 120*a* is a thin film layer formed by sputtering. As a result, the embodiment can minimize damage to the second metal layer 120*b* that occurs in the process of etching the first metal layer 120*a*, which is a seed layer, during a process of forming the circuit pattern layer 120.

That is, in the embodiment, the first metal layer 120*a* includes a different metal material from the second metal layer 120*b*, so that the second metal layer 120*b* is prevented from being etched during the process of etching the first metal layer 120*a*. Furthermore, in the embodiment, the first metal layer 120*a* is a thin film layer, and for this reason, the second metal layer 120*b* is prevented from being etched when the first metal layer 120*a* is etched.

As a result, a surface roughness of the circuit pattern layer 120, a difference value between the upper and lower widths of the circuit pattern layer 120, and an etching factor of the circuit pattern layer 120 are superior to those of the comparative example.

Hereinafter, differences in characteristics of the circuit pattern layer between the embodiment and the comparative example will be described.

FIG. 4 is a scanning electron microscope (SEM) photograph showing a roughness of a circuit pattern layer of a comparative example, and FIG. 5 is a scanning electron microscope (SEM) photograph showing a roughness of a circuit pattern layer of the example.

Referring to FIG. 4, the circuit board of the comparative example includes an insulating layer 11 and a circuit pattern layer 14 disposed on the insulating layer 11. The circuit pattern layer 14 in the comparative example is formed by electroplating a copper foil layer containing copper or a chemical copper plating layer as a seed layer. Accordingly, in the circuit pattern layer 14 of the comparative example, the electrolytically plated metal layer is also etched in the process of etching the seed layer. Accordingly, the surface roughness of the circuit pattern layer 14 of the comparative example has a relatively high value. In addition, in the comparative example circuit pattern layer 14, a line width and a spacing of the plurality of circuit patterns are determined in consideration of etching of the electrolytically plated metal layer.

A 10-point average surface roughness (Rz) of the surface of the circuit pattern layer 14 in the comparative example is 1 μm to 1.5 μm. And the circuit board in the comparative example is difficult to apply to products that use high frequency bands. In other words, as the frequency used in the application to which the circuit board is applied increases, a signal flow moves to a surface of the conductor (circuit pattern layer) due to the skin effect. In addition, when the maximum height illuminance (Ry) of the circuit pattern layer 14 exceeds 1 μm as in the comparative example, signal transmission loss increases in high frequency bands (mm-Wave). Accordingly, the circuit board of the comparative example has a problem in that the characteristics of the signal transmitted through the circuit pattern layer 14 are deteriorated.

In addition, the line width of the plurality of circuit patterns of the circuit pattern layer 120 of the comparative example is about 60 μm, and the spacing between the circuit patterns is about 70 μm. Accordingly, the circuit board in the comparative example has the problem of low circuit integration.

Referring to FIG. 5, the circuit board of the embodiment includes an insulating layer 110 and a circuit pattern layer 120. And, as described above, the circuit pattern layer 120 includes a first metal layer 120*a* containing nickel and chromium and a second metal layer 120*b* containing copper. The first metal layer 120*a* is a thin film layer. Accordingly, the embodiment can prevent the second metal layer 120*b* from being etched during the process of etching the first metal layer 120*a*. Therefore, the embodiment can reduce the 10-point average surface roughness (Rz), line width, and spacing of the circuit pattern layer 120 compared to the comparative example.

Specifically, the maximum height roughness Ry of the surface of the circuit pattern layer 120 of the embodiment is 0.8 μm or less. Preferably, the 10-point average surface roughness Rz of the surface of the circuit pattern layer 120 of the embodiment is 0.7 μm or less, and more preferably, the 10-point average surface roughness Rz of the surface of the circuit pattern layer 120 is 0.5 μm or less.

That is, the 10-point average surface roughness Rz of the surface of the circuit pattern layer 120 in the embodiment ranges from 0.2 μm to 0.5 μm. Preferably, the 10-point average surface roughness Rz of the surface of the circuit pattern layer 120 of the embodiment is 0.2 μm to 0.45 μm or less. More preferably, the 10-point average surface roughness Rz of the circuit pattern layer 120 of the embodiment is 0.2 μm to 0.4 μm.

If the 10-point average surface roughness Rz of the surface of the circuit pattern layer 120 is less than 0.2 μm, the adhesion between the circuit pattern layer 120 and the insulating layer 110 decreases, and as a result, a problem may occur in which the circuit pattern layer 120 is peeled off from the insulating layer 110.

In addition, if the 10-point average surface roughness Rz of the surface of the circuit pattern layer 120 exceeds 0.5 μm, signal transmission loss may increase due to skin effect. That is, if the 10-point average surface roughness Rz of the surface of the circuit pattern layer 120 exceeds 0.5 μm, it may be difficult to apply it to products using a high frequency band.

As described above, the embodiment can lower the 10-point average surface roughness Rz of the surface of the circuit pattern layer 120 compared to the comparative example, thereby improving the characteristics of the signal transmitted through the circuit board.

Furthermore, the line width of the plurality of circuit patterns of the circuit pattern layer 120 in the embodiment ranges from 4 μm to 10 μm. In addition, the spacing between the plurality of circuit patterns of the circuit pattern layer 120 in the embodiment ranges from 6 μm to 14 μm. That is, the line width and spacing of the circuit pattern layer 120 of the embodiment are 20% or less of the line width and spacing of the circuit pattern layer 14 of the comparative example. Accordingly, the embodiment can improve the circuit integration of the circuit board. Furthermore, the embodiment can increase an arrangement area of the circuit pattern layer 120 within the same space, and thus improve the characteristics of the signal transmitted through the antenna pattern.

FIG. 6 is a scanning electron microscope (SEM) photograph for explaining a side surface shape and etching factor of the circuit pattern layer of the comparative example, and FIG. 7 is a scanning electron microscope (SEM) photograph for explaining a side surface shape and etching factor of the circuit pattern layer of the embodiment.

Referring to FIG. 6, the circuit pattern layer 14 of the comparative example includes an upper surface 14T and a side surface 14S. And the side surface 14S of the circuit pattern layer 14 in the comparative example has a curved surface or curved line in a vertical cross section. In other words, the circuit pattern layer 14 of the comparative example has a great difference between the upper width and the lower width. In addition, the circuit pattern layer 14 of the comparative example has a low line straightness. In addition, the circuit pattern layer 14 of the comparative example has a low etching factor.

The difference value between the upper and lower widths of the circuit pattern layer 14 in the comparative example exceeds 13 μm. For example, the upper width of the circuit pattern layer 14 in the comparative example is 80% or less of the lower width of the circuit pattern layer 14. And the line straightness of the circuit pattern layer 14 in the comparative example exceeds 0.68 μm. At this time, the line straightness refers to a straightness of the side surface 14S of the circuit pattern layer 14. Also, the line straightness can be expressed as ½ of the difference value between the upper and lower widths. That is, the line straightness means a horizontal distance w1 between one end of the upper surface 14T and one end of the lower surface connected to the side surface 14S of the circuit pattern layer 14. And, the horizontal distance w1 of the circuit pattern layer 14 in the comparative example exceeds 0.68 μm.

Furthermore, the etching factor of the circuit pattern layer 14 in the comparative example is about 12. Here, the etching factor is a value obtained by dividing a thickness of the circuit pattern layer 14 by the difference value between the upper and lower widths of the circuit pattern layer 14. In addition, the low etching factor means that the difference value between the upper and lower widths of the circuit pattern layer 14 is large.

Referring to FIG. 7, the circuit pattern layer 120 of the embodiment includes an upper surface 120T and a side surface 120S. And the side surface 120S of the circuit pattern layer 120 of the embodiment has a straight line shape that is substantially close to vertical in the vertical cross section. In other words, the difference value between the upper and lower widths of the circuit pattern layer 120 of the embodiment is smaller than that of the comparative example. In addition, the line straightness of the circuit pattern layer 120 of the example is superior to that of the comparative example. In addition, the etching factor of the circuit pattern layer 14 of the embodiment is higher than that of the comparative example.

The difference value between the upper and lower widths of the circuit pattern layer 120 in the embodiment is 1.2 μm or less, 1.0 μm or less, or 0.7 μm or less. Specifically, the difference value between the upper and lower widths of the circuit pattern layer 120 in the embodiment satisfies a range of 0.5 μm to 1.2 μm.

If the difference value between the upper and lower widths of the circuit pattern layer 120 is less than 0.5 μm, plating properties may deteriorate in the process of forming the circuit pattern layer 120. For example, the circuit pattern layer 120 is formed by performing a plating process. At this time, the plating process refers to a process of filling the opening of the dry film (not shown) with a metal material. In addition, the difference value between the upper and lower widths of the circuit pattern layer 120 corresponds to a difference value between the upper and lower widths of the opening. At this time, the plating process must be performed with the inner wall of the opening tapered so that the plating can completely proceed to the lowest region of the opening. In addition, the fact that the difference between the upper and lower widths of the circuit pattern layer 120 is less than 0.5 μm may mean that plating has not completely performed in the lower region of the opening in the plating process. For example, when the difference value between the upper and lower widths of the circuit pattern layer 120 is less than 0.5 μm, undercut may occur on the lower surface of the circuit pattern layer 120, and this may cause a problem in which signal characteristics deteriorate.

In addition, if the difference value between the upper and lower widths of the circuit pattern layer 120 is greater than 1.2 μm, the frequency bandwidth of the signal transmitted by the circuit pattern layer 120 may decrease. Specifically, the frequency bandwidth of the signal may increase as the difference value between the upper width and the lower width becomes smaller. This will be explained with reference to FIGS. 11 and 12. In addition, if the difference value between the upper and lower widths of the circuit pattern layer 120 is greater than 1.2 μm, the frequency band width may decrease as shown in the comparative example of FIG. 11, and this can be a factor in deteriorating the communication characteristics of the circuit board.

That is, the upper width of the circuit pattern layer 120 in the embodiment is 95% or more, further 96% or more, and further 98% or more of the lower width of the circuit pattern layer 120. If the upper width of the circuit pattern layer 120 is less than 95% of the lower width of the circuit pattern layer 120, as described above, plating properties may be reduced in the process of forming the circuit pattern layer 120, As a result, an undercut may be formed on the lower surface of the circuit pattern layer 120.

In addition, a horizontal distance W1 between one end and one end of the lower surface of the upper surface 120 connected to the side surface 120 of the circuit pattern layer 120 of the embodiment is 0.6 μm or less, 0.5 μm or less, or 0.35 μm or less. Specifically, the horizontal distance W1 of the circuit pattern layer 120 of the embodiment satisfies a range of 0.25 μm to 0.6 μm. If the horizontal distance W1 of the circuit pattern layer 120 of the embodiment is less than 0.25 μm, as described above, plating properties may be deteriorated in the process of forming the circuit pattern layer 120, and this may cause an undercut to form on the lower surface of the circuit pattern layer 120. In addition, when the horizontal distance W1 of the circuit pattern layer 120 of the embodiment exceeds 0.6 μm, as described above, the frequency bandwidth may be reduced, and the communication characteristics of the circuit board may accordingly deteriorate.

Furthermore, the etching factor of the circuit pattern layer 120 in the embodiment is 40 or more. If the etching factor of the circuit pattern layer 120 is less than 40, the difference value between the upper and lower widths of the circuit pattern layer 120 and/or the horizontal distance W1 may be outside the target range, and this may cause problems with deterioration of plating properties or reduction of frequency bandwidth.

FIG. 8 is a scanning electron microscope (SEM) photograph showing a surface of a circuit pattern layer of a comparative example, and FIG. 9 is a scanning electron microscope (SEM) photograph showing the surface of a circuit pattern layer of an example.

Referring to FIG. 8, the circuit pattern layer 14 of the comparative example includes an upper surface 14T, a side surface 14S, and a lower surface 14B. In addition, it can be seen that the upper surface 14T, side surface 14S, and lower surface 14B of the circuit pattern layer 14 of the comparative example are quite rough due to the characteristics of the seed layer.

Referring to FIG. 9, the circuit pattern layer 120 of the embodiment includes an upper surface 120T, a side surface 120S, and a lower surface 120B. In addition, it can be seen that the upper surface 120T, side surface 120S, and lower surface 120B of the circuit pattern layer 120 of the embodiment are significantly smooth compared to the comparative example due to the characteristics of the seed layer.

FIG. 10 is a view showing signal characteristics according to the roughness of the circuit pattern layer.

Referring to FIG. 10, the 10-point average surface roughness Rz of the circuit pattern layer 120 of the embodiment is smaller than the 10-point average surface roughness Rz of the circuit pattern layer 14 of the comparative example. As a result, it can be confirmed that there is a low signal loss (S21, dB/mm) in the same frequency region compared to the comparative example.

Specifically, referring to the first signal loss characteristic (C) of FIG. 10, it can be seen that a signal loss of about-0.148 dB/mm occurs in the 28 GHz frequency band.

In contrast, it can be confirmed that the second signal loss characteristic E1 and the third signal loss characteristic E2 of FIG. 10 have lower signal loss than the first signal loss characteristic (C).

The second signal loss characteristic E1 shows the signal loss when the 10-point average surface roughness (Rz) of the circuit pattern layer 120 is 0.3 μm, and the third signal loss characteristic E2 shows the signal loss when the 10-point average surface roughness (Rz) is 0.2 μm.

Based on the second signal loss characteristic E1, it was confirmed that a signal loss as low as 0.0237 dB occurred in the same frequency band (28 GHz) compared to the first signal loss characteristic (C) of the comparative example.

Based on the third signal loss characteristic E1, it was confirmed that a signal loss as low as 0.0445 dB occurred in the same frequency band (28 GHz) compared to the first signal loss characteristic (C) in the comparative example.

FIG. 11 is a view showing the frequency bandwidth of a circuit board according to a comparative example, and FIG. 12 is a view showing the frequency bandwidth of a circuit board according to an embodiment.

Referring to FIG. 11, it was confirmed that the comparative example can use a frequency band of 27.3 GHz to 30.7 GHZ, based on the frequency band in which signal loss is −6 dB or less.

And, referring to FIG. 12, it was confirmed that the embodiment can use a frequency band of 26.8 GHz to 30.8 GHZ, based on the frequency band in which signal loss is −6 dB or less. In other words, it was confirmed that the frequency band available in the circuit board of the embodiment was wider than the frequency band available in the circuit board of the comparative example.

Thereby, the embodiment can provide a circuit board with antenna characteristics of a wider bandwidth than the comparative example.

FIG. 13 is a view showing an antenna device according to an embodiment, and FIG. 14 is a view showing a part of a terminal to which the antenna device of FIG. 13 is applied.

Referring to FIG. 13, the antenna device includes a circuit board. The circuit board includes an insulating layer 210, a circuit pattern layer 220, a through electrode 230, and a protective layer 240. Since the embodiment circuit board has already been described in FIG. 2, detailed description thereof will be omitted.

The circuit board of the embodiment is divided into a plurality of regions in a horizontal direction.

The circuit board includes a first region R1 and a second region R2. And each of the first region R1 and the second region R2 of the circuit board includes the insulating layer 210, the circuit pattern layer 220, the through electrode 230, and the protective layer 240.

At this time, the first region R1 refers to a rigid region with rigid characteristics in the circuit board. In addition, the second region R2 refers to a flexible region with flexible characteristics on the circuit board.

At this time, the insulating layer included in the first region R1 is the same as the insulating layer included in the second region R2. And, in the embodiment, the number of layers of the insulating layer in the first region R1 and the second region R2 is different. Accordingly, the first region R1 with relatively many layers has rigid characteristics, and the second region R2 with relatively few layers has flexible characteristics.

Accordingly, the second region R2 of the circuit board can be bent based on the first region R1. Accordingly, the embodiment can transmit antenna signals in different directions from the antenna device.

Specifically, the circuit pattern layer 220 includes a first antenna pattern layer 220*a* included in the first region R1 of the circuit board. In addition, the first antenna pattern layer 220*a* may radiate an antenna signal in a first direction from the structure 300 (e.g., a case of a terminal) on which the antenna device is mounted.

In addition, the circuit pattern layer 220 includes a second antenna pattern layer 220*b* included in the second region R2 of the circuit board. And the second antenna pattern layer 220*b* may radiate an antenna signal in a second direction different from the first direction from the structure 300 on which the antenna device is mounted. At this time, the first direction may be perpendicular to the second direction, but is not limited thereto.

The structure 300 refers to a main body 300 that forms the exterior of the terminal.

For example, the antenna device of the embodiment is placed in a terminal. Here, the terminal can be any one of mobile phones, mobile phones, smart phones, portable smart devices, digital cameras, laptop computers, digital broadcasting terminals, PDAs (Personal Digital Assistants), PMPs (Portable Multimedia Players), and navigation devices.

The terminal includes a main body 300, a display unit (not shown), and an antenna device disposed in the main body 300.

The main body 300 forms the exterior of the terminal. For example, the main body 300 may have a rectangular parallelepiped shape. As another example, the main body 300 may be formed to be at least partially rounded. The antenna device of the embodiment is disposed in the main body 300. And, the display unit is disposed on one side of the main body.

That is, the main body 300 includes a plurality of outer surfaces. For example, the main body 300 includes a front surface on which the display unit is disposed, a rear surface opposite to the front surface, and a plurality of side surfaces between the front surface and the rear surface.

In addition, the antenna device of the embodiment bends the first region R1 and the second region R2 to be disposed on at least two of the plurality of outer surfaces of the main body 300.

For example, the main body 300 includes four side surfaces. And, the first region R1 of the antenna device is disposed on the first side surface of any one of the four side surfaces, and the second region R2 may be disposed on a second side surface connected to the first side surface among the four side surfaces.

Alternatively, the first region R1 of the antenna device may be disposed on the rear surface, and the second region R2 may be disposed on any one of the four side surfaces connected to the rear surface.

However, the first region R1 of the antenna device of the embodiment is a rigid region in which at least one element is mounted, and is provided at the rear of the main body 300 to secure placement space and improve element reliability.

In addition, in the embodiment, the antenna device can be used without bending the first region R1 and the second region R2. In this case, the first antenna pattern layer 220*a* and the second antenna pattern layer 220*b* each radiate antenna signals in the same first or second direction at positions spaced apart from each other.

Meanwhile, the circuit pattern layer 220 includes a plurality of pads. The circuit pattern layer 220 includes a first pad 220*c* and a second pad 220*d*.

The first pad 220*c* and the second pad 220*d* refer to circuit pattern layers disposed on an outermost layer of the circuit board. The first pad 220*c* and the second pad 220*d* are disposed in the first region R1 of the circuit board. At this time, in the drawing, the first pad 220*c* and the second pad 220*d* are shown as being disposed on an uppermost side of the circuit board, but is not limited thereto. For example, one of the first pad 220*c* and the second pad 220*d* may be provided on the uppermost side of the circuit board, and the other may be provided on the lowermost side of the circuit board.

A first connection part 250 is disposed on the first pad 220*c*. In addition, a second connection part 260 is disposed on the second pad 220*d*. The first connection part 250 and the second connection part 260 may be solder balls, but are not limited thereto.

A first element 270 is disposed on the first connection part 250. And, a second element 280 is disposed on the second connection part 260.

The first element 270 is a communication element (RFIC). The first element 270 is connected to the first antenna pattern layer 220*a* and the second antenna pattern layer 220*b*, respectively. Through this, the embodiment can control the first antenna pattern layer 220*a* and the second antenna pattern layer 220*b*, which radiate antenna signals to different regions, using one first element 270, respectively.

The second element 280 is a power supply device (PMIC). The second element 280 is electrically connected to the first element 270. The second element 280 receives a control signal transmitted from the first element 270. The second element 280 controls power supplied to the first antenna pattern layer 220*a* and the second antenna pattern layer 220*b* based on the received control signal.

The embodiment may provide a circuit board with improved antenna characteristics and an antenna device including the same.

Specifically, the circuit board of the embodiment includes a circuit pattern layer corresponding to an antenna pattern. The circuit pattern layer includes a first metal layer, which is a thin film layer containing a first metal, and a second metal layer disposed on the first metal layer and containing a second metal. At this time, in the embodiment, the second metal layer is formed using the first metal layer. Accordingly, the embodiment can minimize damage to the second metal layer that occurs during a process of etching the first metal layer.

Accordingly, a 10-point average surface roughness (Rz) of a surface of the circuit pattern layer of the embodiment has a range of 0.2 μm to 0.5 μm. In addition, a difference value between upper and lower widths of the circuit pattern layer in the embodiment satisfies a range of 0.5 μm to 1.2 μm. In addition, the upper width of the circuit pattern layer in the embodiment is 95% or more of the lower width of the circuit pattern layer. Furthermore, a horizontal distance W1 between one end of the upper surface and one end of the lower surface connected to a side surface of the circuit pattern layer of the embodiment satisfies a range of 0.25 μm to 0.6 μm. Furthermore, the etching factor of the circuit pattern layer of the embodiment is 40 or more.

Accordingly, the circuit board of the embodiment and the antenna device including the same can reduce signal transmission loss that occurs in the process of transmitting a signal in a high frequency band. Furthermore, the circuit board of the embodiment and the antenna device including the same can improve frequency bandwidth.

In addition, the circuit board of the embodiment includes a first region and a second region spaced apart from each other in the horizontal direction including each of first and second antenna pattern layers. In addition, the second region is a flexible region that can be bent relative to the first region. In addition, a communication element connected to the first and second antenna pattern layers is disposed in the first region. The first and second antenna pattern layers radiate antenna signals in different directions. In addition, the communication element controls the first and second antenna pattern layers. Accordingly, the embodiment can control a plurality of antenna pattern layers that radiate antenna signals in different directions using one communication element. Through this, the embodiment enables miniaturization of the antenna device.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

an insulating layer; and a circuit pattern layer disposed on the insulating layer and including an antenna pattern, wherein the antenna pattern includes an upper surface and a lower surface opposite to the upper surface, wherein a width of the upper surface is different from the width of the lower surface, wherein the width of one of the upper and lower surfaces is 95% or more of the width of the other surface, and wherein the antenna pattern includes a first metal layer disposed on the insulating layer, and a second metal layer disposed on the first metal layer and containing a different metal from the first metal layer.

2. The circuit board of claim 1, wherein a width of the upper surface of the antenna pattern is smaller than a width of the lower surface of the antenna pattern.

3. The circuit board of claim 2, wherein a difference between the width of the upper surface and the lower surface of the antenna pattern satisfies a range of 0.5 μm to 1.2 μm.

4. The circuit board of claim 1, wherein a 10-point average surface roughness (Rz) of a surface of the antenna pattern has a range of 0.2 μm to 0.5 μm.

5. The circuit board of claim 1, wherein the antenna pattern includes a side surface connecting the upper surface and the lower surface, and wherein a horizontal distance between one end of the upper surface of the antenna pattern and one end of the lower surface of the antenna pattern connected to the side surface of the antenna pattern satisfies a range of 0.25 μm to 0.6 μm.

6. The circuit board of claim 5, wherein the side surface of the antenna pattern includes a curved surface.

7. The circuit board of claim 6, wherein the side surface includes a first side surface and a second side surface opposite to the first side surface, wherein the first side surface is concave toward the second side surface, and wherein the second side surface is concave toward the first side surface.

8. The circuit board of claim 1, wherein an etching factor of the antenna pattern is 40 or more, and wherein the etching factor is determined by a following formula:

etching factor=thickness of antenna pattern/(width of lower surface of antenna pattern−width of upper surface of antenna pattern).

9. The circuit board of claim 1, wherein the first metal layer includes nickel and chromium, and wherein the second metal layer includes copper.

10. The circuit board of claim 1, wherein the insulating layer is divided into a first region and a second region in a horizontal direction, wherein the antenna pattern includes:

a first antenna pattern disposed in the first region of the insulating layer; and a second antenna pattern disposed in the second region of the insulating layer, wherein a number of layers in the first region of the insulating layer is greater than a number of layers in the second region of the insulating layer, and wherein the second region of the insulating layer is bent based on the first region of the insulating layer.

11. The circuit board of claim 10, wherein an insulating material of the first region of the insulating layer is the same as an insulating material of the second region of the insulating layer, and wherein the insulating material includes liquid crystal polymer (LCP).

12. An antenna device comprising:

an insulating layer including a first region and a second region bendable relative to the first region;

a first antenna pattern disposed in the first region of the insulating layer;

a second antenna pattern disposed in the second region of the insulating layer;

a first pad disposed in the first region of the insulating layer;

a second pad disposed in the first region of the insulating layer;

a first connection part disposed on the first pad;

a second connection part disposed on the second pad;

a communication element mounted on the first connection part and connected to the first and second antenna patterns; and a power element mounted on the second connection part and connected to the first and second antenna patterns, wherein at least one of the first and second antenna patterns includes an upper surface and a lower surface opposite to the upper surface, wherein a width of the upper surface is different from the width of the lower surface, and wherein the width of one surface of the upper and lower surfaces is 95% or more of the width of the other surface.

13. The antenna device of claim 12, wherein a width of the upper surface is smaller than the width of the lower surface.

14. The antenna device of claim 13, wherein a difference between the width of the upper surface and the width of the lower surface satisfies a range of 0.5 μm to 1.2 μm.

15. The antenna device of claim 12, wherein at least one of the first and second antenna patterns include a side surface connecting the upper surface and the lower surface, and wherein a horizontal distance between one end of the upper surface and one end of the lower surface, which are respectively connected to one end and the other end of the side surface, satisfies a range of 0.25 μm to 0.6 μm.

16. The antenna device of claim 12, wherein at least one of the first and second antenna patterns includes:

a first metal layer disposed on the insulating layer and including nickel and chromium; and a second metal layer disposed on the first metal layer and including copper.

17. The antenna device of claim 12, wherein an insulating material of the first region of the insulating layer is the same as an insulating material of the second region of the insulating layer, and wherein the insulating material includes liquid crystal polymer (LCP).

18. The antenna device of claim 12, wherein a 10-point average surface roughness (Rz) of each surface of the first and second antenna patterns has a range of 0.2 μm to 0.5 μm.

19. A terminal comprising:

a main body including a front surface, a rear surface opposite to the front surface, and a plurality of side surfaces between the front and rear surfaces;

a display unit disposed on the front surface of the main body; and an antenna device according to claim 12, which is disposed on at least two of the rear surface and the plurality of side surfaces of the main body, wherein the first region of the insulating layer of the antenna device is disposed on the rear surface of the main body, and wherein the second region of the insulating layer of the antenna device is disposed on a first side surface connected to the rear surface of the main body among a plurality of side surfaces of the main body, and wherein the first antenna pattern radiates an antenna signal toward the rear surface of the main body, and wherein the second antenna pattern radiates an antenna signal toward a second side surface of the main body.

* * * * *